US005843617A

United States Patent [19]

Patel et al.

[11] Patent Number: 5,843,617

[45] Date of Patent: Dec. 1, 1998

[54] THERMAL BLEACHING OF INFRARED DYES

[75] Inventors: Ranjan C. Patel; Mark R. I. Chambers, both of St. Paul, Minn.; Dian E. Stevenson, Saffron Walden, England; Robert J. D. Nairne, Bishops Stortford, United Kingdom; Gregory L. Zwaldo, Ellsworth, Wis.

[73] Assignee: Minnesota Mining & Manufacturing Company, St. Paul, Minn.

[21] Appl. No.: 841,420

[22] Filed: Apr. 22, 1997

[30] Foreign Application Priority Data

Aug. 20, 1996 [GB] United Kingdom .................. 9617416

[51] Int. Cl.[6] .............................. G03C 5/16; G03C 7/02; G03F 7/34

[52] U.S. Cl. .......................... 430/201; 430/200; 430/339; 430/920; 430/944; 430/964; 430/404; 430/462; 430/463; 8/107

[58] Field of Search .................................... 430/200, 201, 430/339, 920, 927, 944, 964, 404, 462, 463; 8/107

[56] References Cited

U.S. PATENT DOCUMENTS

| | | | |
|---|---|---|---|
| 2,701,245 | 2/1955 | Lynn | 260/89.5 |
| 2,890,969 | 6/1959 | Schossberger et al. | 117/36 |
| 3,129,661 | 4/1964 | Newman | 101/149.2 |
| 3,787,210 | 1/1974 | Roberts | 96/27 E |
| 3,964,359 | 6/1976 | Peterson | 101/467 |
| 4,447,521 | 5/1984 | Tiers et al. | 430/337 |
| 4,501,808 | 2/1985 | Sakai et al. | 430/59 |
| 4,514,493 | 4/1985 | Hirai et al. | 430/617 |
| 4,529,684 | 7/1985 | Sasagawa et al. | 430/269 |
| 4,540,618 | 9/1985 | Suzuki et al. | 428/141 |
| 4,588,674 | 5/1986 | Stewart et al. | 430/273 |
| 4,602,263 | 7/1986 | Borror et al. | 346/201 |
| 4,634,652 | 1/1987 | Barton | 430/156 |
| 4,663,269 | 5/1987 | Narang et al. | 430/326 |
| 4,720,450 | 1/1988 | Ellis | 430/339 |
| 4,788,128 | 11/1988 | Barlow | 430/200 |

(List continued on next page.)

FOREIGN PATENT DOCUMENTS

| | | | |
|---|---|---|---|
| 0 403 157 | 6/1990 | European Pat. Off. | G03C 1/498 |
| 0 454 083 | 4/1991 | European Pat. Off. | B41M 5/34 |
| 0 465 727 | 1/1992 | European Pat. Off. | B41M 5/38 |
| 0 488 430 | 6/1992 | European Pat. Off. | C09D 11/00 |
| 0 530 018 | 8/1992 | European Pat. Off. | B41M 5/40 |
| 0 515 133 | 11/1992 | European Pat. Off. | C07D 311/82 |
| 0 544 284 | 11/1992 | European Pat. Off. | B41M 5/40 |
| 0 566 103 | 4/1993 | European Pat. Off. | B41M 5/40 |

(List continued on next page.)

OTHER PUBLICATIONS

M.L. Levene et al., "Material Transfer Recording", *Applied Optics,* 9(10) 2260–2265 (1970).

C. Pac et al., "Ru(bpy)$_3^{2+}$–Mediated Photoreduction of Olefins with 1–Benzyl–1,4–dihydronicotinamide: A Mechanistic NAD(P)H–Model Compounds[1]", *Amer.Chem. Soc.,* 103, 6495–6497 (1981).

D. Teegarden et al., "Contrast Enhancement Lithography System Based on Pyrylium Dye Bleach Chemistry", *J. Imag. Sci. Tech.,* 37, 149–155 (1993).

X. Zhang et al., "Laser–Initiated Synthesis: 2,4,5, 7–Tetraiodo–6–hydroxy–3–fluorone as a Visible Photoinitiator", *J. Org. Chem.,* 58, 2614–2618 (1993).

D. Hare et al., "Fundamental Mechanisms of Laser Ablation Transfer Imaging", *IS&T's Tenth Int'l Congress on Advances in Non–Impact Printing Technologies,* 314–316 (1994).

(List continued on next page.)

*Primary Examiner*—Richard L. Schilling

[57] ABSTRACT

An imaging method is provided that includes a tetraarylpolymethine dye, and bleaching this dye by bringing the dye into contact with a 4-alkyl or 4-unsubstituted 1,4-dihydropyridine derivative.

12 Claims, 1 Drawing Sheet

U.S. PATENT DOCUMENTS

| | | | |
|---|---|---|---|
| 4,857,431 | 8/1989 | Kato et al. | 430/91 |
| 4,876,235 | 10/1989 | DeBoer | 503/227 |
| 4,897,310 | 1/1990 | Beyer et al. | 428/412 |
| 4,950,639 | 8/1990 | DeBoer et al. | 503/227 |
| 4,973,572 | 11/1990 | DeBoer | 503/227 |
| 5,017,547 | 5/1991 | DeBoer | 503/227 |
| 5,053,381 | 10/1991 | Chapman et al. | 503/227 |
| 5,089,372 | 2/1992 | Kirihata et al. | 430/167 |
| 5,126,760 | 6/1992 | DeBoer | 346/108 |
| 5,135,842 | 8/1992 | Kitchin et al. | 430/510 |
| 5,156,938 | 10/1992 | Foley et al. | 430/200 |
| 5,171,650 | 12/1992 | Ellis et al. | 430/20 |
| 5,219,703 | 6/1993 | Bugner et al. | 430/200 |
| 5,232,817 | 8/1993 | Kawakami et al. | 430/201 |
| 5,246,909 | 9/1993 | Thien et al. | 503/227 |
| 5,254,524 | 10/1993 | Guittard et al. | 503/227 |
| 5,256,506 | 10/1993 | Ellis et al. | 430/20 |
| 5,266,452 | 11/1993 | Kitchin et al. | 430/510 |
| 5,278,576 | 1/1994 | Kaszczuk et al. | 346/1.1 |
| 5,314,795 | 5/1994 | Helland et al. | 430/517 |
| 5,395,729 | 3/1995 | Reardon et al. | 430/200 |
| 5,395,747 | 3/1995 | Helland et al. | 430/510 |
| 5,401,606 | 3/1995 | Reardon et al. | 430/200 |
| 5,441,794 | 8/1995 | Hitomi et al. | 428/195 |
| 5,475,418 | 12/1995 | Patel et al. | 347/256 |
| 5,501,937 | 3/1996 | Matsumoto et al. | 430/200 |
| 5,663,033 | 9/1997 | Warner et al. | 430/257 |
| 5,705,314 | 1/1998 | Kapusniak et al. | 430/254 |

FOREIGN PATENT DOCUMENTS

| | | | |
|---|---|---|---|
| 0 593 364 | 10/1993 | European Pat. Off. | B41J 2/48 |
| 0 602 893 | 12/1993 | European Pat. Off. | B41M 5/38 |
| 0 675 003 | 3/1995 | European Pat. Off. | B41M 5/38 |
| 0 687 568 | 12/1995 | European Pat. Off. | B41M 5/24 |
| 0 738 609 | 4/1996 | European Pat. Off. | B41M 5/28 |
| 0 738 930 | 4/1996 | European Pat. Off. | G03F 7/095 |
| 51-88016 | 1/1975 | Japan | G03C 1/72 |
| 56-46789 | 4/1981 | Japan | B41M 5/26 |
| 63-319191 | 12/1981 | Japan | B41M 5/26 |
| 63-319192 | 12/1981 | Japan | B41M 5/26 |
| 57-014095 | 1/1982 | Japan | B41M 5/18 |
| 60-234888 | 11/1985 | Japan | B41M 5/26 |
| 61-137790 | 6/1986 | Japan | B41M 5/26 |
| 61-206691 | 12/1986 | Japan | B41M 5/26 |
| 61-291184 | 12/1986 | Japan | B41M 5/26 |
| 63-022684 | 1/1988 | Japan | B41M 5/26 |
| 63-161445 | 7/1988 | Japan | G03C 1/00 |
| 63-185680 | 8/1988 | Japan | B41M 5/26 |
| 64-1589 | 1/1989 | Japan | B41M 5/26 |
| 4-189189 | 7/1992 | Japan | B41M 5/40 |
| 4-327982 | 2/1993 | Japan | B41M 3/12 |
| 5-139036 | 6/1993 | Japan | B41M 5/26 |
| 82-267944 | 10/1996 | Japan | B41M 5/40 |
| 2 176 018 | 12/1986 | United Kingdom | B41M 5/26 |
| WO 88/04237 | 6/1988 | WIPO | B41M 5/26 |
| WO 90/12342 | 10/1990 | WIPO | G03C 1/492 |
| WO 93/03928 | 3/1993 | WIPO | B41M 5/40 |
| WO 93/04411 | 3/1993 | WIPO | G03G 17/10 |
| WO 94/04368 | 3/1994 | WIPO | B41M 5/26 |
| WO 95/13195 | 5/1995 | WIPO | B41M 5/38 |

OTHER PUBLICATIONS

D. Hare et al., "Highly time–and space–resolved studies of superfast image production using laser ablation transfer", *Microchemistry,* 123–135 (1994).

H. Kim et al., "Molecular dynamics simulation of nanoscale thermal conduction and vibrational cooling in a crystalline naphthalene cluster",*J. Chem. Phys.* , 94 8203–8209 (1991).

I. Lee et al., "Direct measurement of polymer temperature during laser ablation using amolecular thermometer", *J. Appl., Phys.,* 72, 2440–2448 (1992).

I. Lee et al., "Dynamics of Laser Ablation Transfer Imaging Investigated by Ultrafast Microscopy", *J. Imag. Sci. Tech.,* 36, 180–187 (1992).

G. Pinto, "Dynamics of Laser Ablation Transfer Thermal Imaging: Fundamental Mechanisms Investigated by SIMS Surface Analysis", *J. Imag. Sci. Tech.,* 38, 565–570 (1994).

R. Srinivasan et al., "Ultraviolet Laser Ablation of Organic Polymers", *Chem. Rev.,* 89, 1303–1316 (1989).

W. Tolbert et al., "High–Speed Color Imaging by Laser Ablation Transfer with a Dynamic Release Layer: Fundamental Mechanisms", *J. Imag. Sci. Tech.,* 37, 411–421 (1993).

W. Tolbert et al., "Laser Ablation Transfer Imaging Using Picosecond Optical Pulses: Ultra–High Speed, Lower Threshold and High Resolution", *J. Imag. Sci. Tech.,* 37 485–489 (1993).

W. Tolbert et al., "Ultrafast Dynamics of Photothermal Polymer Ablation",*American Institute of Physics, AIP Conf. Proceedings 288,* 559–568 (Apr. 1993).

X. Wen et al., "Multiphonon up–pumping and molecular hot spots in superheated polymers studied by ultrafast optical calorimetry", *Chem. Phys. Ltrs.,* 192, 315–320 (1992).

J. Yeh. "Laser ablation of polymers", *J. Vac. Sci. Tech.,* 4, 653–658 (1986).

S. Chen et al., "Applications of Ultrafast Temperature jump Spectroscopy to Condensed Phase Molecular Dynamics", *J. Phys. Chem.,* 96, 7178–7186 (1992).

T.J. Chuang, "Laser–Photoetching Characteristics of Polymers with Dopants", *Applied Physics A,* 45, 277–288 (1988).

D. Dlott, "Ultrafast microscopy and ultrafast calorimetry studies of laser polymer ablation", *20$^{th}$ Int'l Congress—SPIE,* 870–879 (1992).

THERMAL BLEACHING OF INFRARED DYES

FIELD OF THE INVENTION

The invention relates to a method of bleaching a particular class of infrared dyes, which may be used as photothermal converters in colorant transfer media, by bringing the dyes into contact with a 4-alkyl or 4-unsubstituted 1,4-dihydropyridine derivative. The method provides an effective means of improving the fidelity of colored images formed via laser thermal transfer of colorant from a donor to a receptor.

BACKGROUND OF THE INVENTION

There is growing interest in the generation of color images via thermal transfer, and in particular via thermal transfer that is mediated by IR radiation. In such a system, a donor sheet comprising a layer of colorant is placed in contact with a receptor, an IR absorber being present in one or both of the donor sheet and receptor. Most commonly, the IR absorber is present only in the donor. When the assembly is exposed to a pattern of IR radiation, normally from a scanning laser source, the radiation is absorbed by the IR absorber, causing a rapid build-up of heat in the exposed areas, which in turn causes transfer of colorant from the donor to the receptor in those areas. By repeating the process with one or more different colored donors, a multi-color image can be assembled on a common receptor. The system is particularly suited to the color proofing industry, where color separation information is routinely generated and stored electronically and the ability to convert such data into hardcopy via digital address of "dry" media is seen as an advantage.

The heat generated in the donor element may cause colorant transfer by a variety of mechanisms. For example, there may be a rapid build up of pressure as a result of decomposition of binders or other ingredients to gaseous products, causing physical propulsion of colorant material to the receptor (ablation transfer), as disclosed in U.S. Pat. No. 5,171,650 and WO90/12342.

Alternatively, the colorant and associated binder materials may transfer in a molten state (melt-stick transfer), as disclosed in JP63-319192 and EP-A-0602893. Both of these mechanisms produce mass transfer, i.e., there is essentially 0% or 100% transfer of colorant depending on whether the applied energy exceeds a certain threshold. Diffusion or sublimation transfer involves a different mechanism in which a colorant is diffused (or sublimed) to the receptor without co-transfer of binder. This process enables the amount of colorant transferred to vary continuously with the input energy. Examples of this process are disclosed, for example, in U.S. Pat. No. 5,126,760.

A problem common to all these imaging methods is that of transfer of some or all of the IR absorber along with the colorant. Unless the IR absorber is completely colorless, the final image is contaminated and not a true color reproduction, and hence unacceptable for high quality proofing purposes. Attempts have been made to minimize co-transfer by placing the IR absorber in a layer separate from the colorant, which may affect the sensitivity, and to find IR absorbers with minimal visible absorption (see, for example, EP-A-0157568). In practice, however, there is nearly always some residual absorption, which has limited the usefulness of the technology. If the IR absorber is present in the receptor from the outset, as disclosed, for example, in WO94/04368, then the problem of contamination and color fidelity is even more acute.

U.S. Pat. No. 5,219,703 discloses laser-induced thermal dye transfer using heat transferable dyes, bleachable and heat transferable near-infrared absorbing sensitizers, acid photogenerating compounds and optionally near-ultraviolet absorbing sensitizers. The combination of the near-infrared absorbing sensitizer and acid photogenerating compounds effects transfer of the heat transferable dyes and bleaching of the near-infrared absorbing sensitizer to eliminate unwanted visible light absorption. The acid photogenerating compound may be present in either the dye donor or dye receiver element. If the acid photogenerator is in the dye donor, bleaching will occur upon initial exposure of the dye donor to near-infrared or near-ultraviolet radiation. If present in the dye receiver element, bleaching will occur upon subsequent exposure of the dye receiver to near-infrared or near-ultraviolet radiation.

EP-A-0675003 discloses the use of thermal bleaching agents in laser thermal transfer imaging, and in particular the use of amines, amine-generating species or carbanion-generating species to bleach cationic dyes such as tetraarylpolymethine dyes and amine cation radical dyes. The bleaching agents are typically located in a resin layer on the surface of the receptor, or are brought into contact with the image in a separate transfer step subsequent to the laser transfer step(s). The preferred bleaching agents are carbanion-generating species, such as quaternary ammonium salts of arylsulphonylacetic acids.

There is a continuing need to provide alternative bleaching agents for IR dyes, suitable for use in laser thermal transfer imaging, particularly as coatings containing the aforementioned quaternary ammonium salts of arylsulphonylacetic acids have shown a tendency for yellowing on storage.

SUMMARY OF THE INVENTION

In accordance with the invention there is provided an imaging method comprising the sequential steps of:

(a) assembling in mutual contact a receptor sheet and a colorant donor sheet, said colorant donor sheet comprising a support and a layer of thermally transferable colorant, and at least one of said receptor sheet and said colorant donor sheet comprising an infrared-absorbing tetraarylpolymethine dye which has a polymethine chain of at least 5 carbon atoms, each terminal carbon atom of said chain bearing two aryl substituents, and a maximum of three of said aryl groups bearing a tertiary amino substituent;

(b) exposing the assembly to laser radiation so that absorption of said laser radiation by said infrared-absorbing tetraarylpolymethine dye generates heat and causes transfer of a colorant image from the donor sheet to the receptor sheet in irradiated areas; and (c) separating the donor and receptor sheets; wherein a thermal bleaching agent is brought into contact with infrared-absorbing tetraarylpolymethine dye present in the receptor after imaging, said bleaching agent having the structure (formula I):

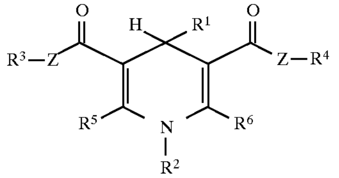

wherein: $R^1$ is H or an alkyl group; $R^2$ is H, an alkyl group, or an aryl group; $R^3$–$R^6$ are independently selected from the group of alkyl groups and aryl groups (including fused rings formed from $R^5$ together with $R^2$ or $R^3$ and/or fused rings formed from $R^6$ together with $R^2$ or $R^4$); and each Z is independently oxygen or a single bond (i.e., $R^4$ is directly bonded to the carbonyl group).

If the infrared absorbing tetraarylpolymethine dye is not present in the receptor prior to imaging, the bleaching agent may be provided in the receptor. In the alternative, the bleaching agent is brought into contact with the image residing on the receptor sheet after separation of the donor and receptor sheets.

The invention further provides a receptor element for use in laser thermal transfer imaging comprising a substrate and a resin layer containing a compound of formula I, said receptor element being otherwise essentially free from photosensitive or other image forming chemicals.

The invention further provides a bleaching agent donor element (i.e., a bleaching sheet) for use in laser thermal transfer imaging comprising a substrate and a resin layer containing a compound of formula I, said bleaching sheet being otherwise essentially free from photosensitive or other image forming chemicals.

Compounds of formula I are unexpectedly found to act as thermal bleaching agents towards certain infrared-absorbing tetraarylpolymethine dyes (TAPM dyes) which are frequently used as photothermal converters in laser transfer media. The invention provides a convenient and effective means of removing any unwanted coloration caused by the presence of the TAPM dyes on the receptor.

The term "thermal bleaching agent" used herein refers to bleaching agents which do not require exposure to light to become active, but will bleach dyes at ambient or elevated temperatures. The term "bleaching" means a substantial reduction in absorptions giving rise to color visible to the human eye, regardless of how this is achieved. For example, there may be an overall reduction in the intensity of the absorption, or it may be shifted to non-interfering wavelengths, or there may be a change in shape of the absorption band, such as, a narrowing, sufficient to render the IR absorber colorless.

DETAILED DESCRIPTION OF PREFERRED EMBODIMENTS

Figure 1:
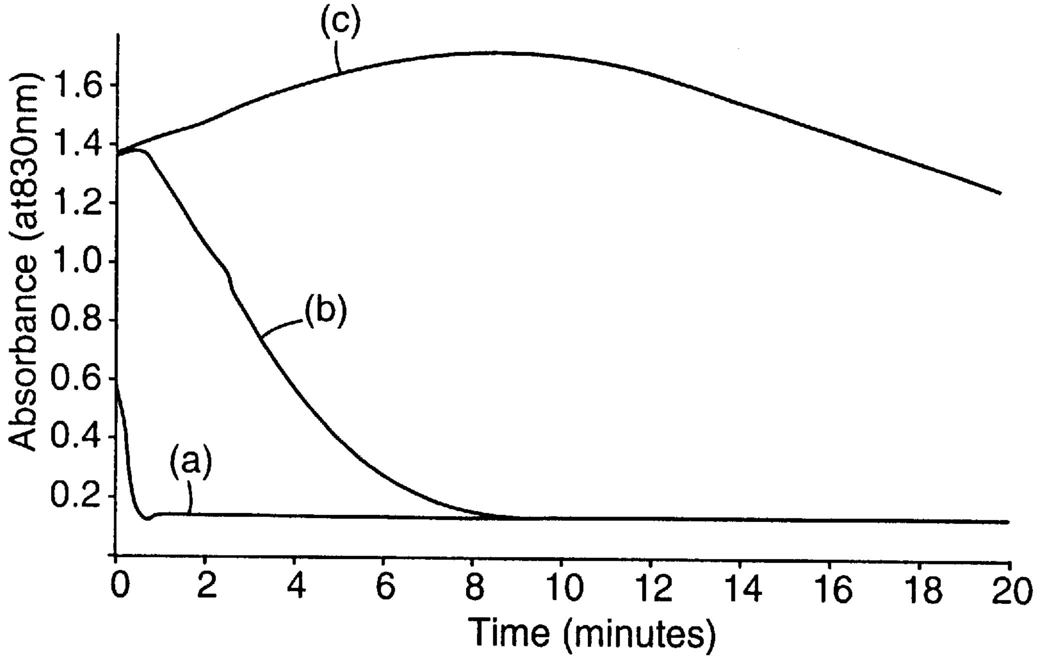
FIG. 1 is a plot of optical density at 830 nm vs. heating time (i.e., storage of laminated donor-receptor assemblies at 100° C.).

In the imaging method of the invention, the thermal bleaching agent of formula I (above) may be present from the outset in a receptor layer on the surface of the receptor element, but it is equally possible to deposit the thermal bleaching agent of formula I on the transferred image by appropriate means in an additional step subsequent to step (c) of the imaging method of the invention. Although the latter alternative requires an extra step, it has the advantage that no particular constraints are placed on the nature of the receptor, so that a variety of materials may be used for this purpose, including plain paper and conventional proofing bases. The former alternative streamlines the imaging process, but requires the use of a specially-prepared receptor. In a further embodiment, the image residing on the receptor element after step (c) may be further transferred to a second receptor which comprises a layer containing a thermal bleaching agent of formula I.

In formula I, $R^1$ is preferably H or an alkyl group of up to 5 carbon atoms; $R^2$ is preferably H or an alkyl group of up to 15 carbon atoms or an aryl group of up to 10 carbon atoms; $R^3$ and $R^4$ are preferably alkyl groups of up to 15 carbon atoms; $R^5$ and $R^6$ are preferably alkyl groups of up to 5 carbon atoms; and Z is preferably oxygen.

As is well understood in this area, substitution is not only tolerated, but is often advisable, and substitution is anticipated on the compounds used in the present invention. As a means of simplifying the discussion and recitation of certain substituent groups, the terms "group" and "moiety" are used to differentiate between those chemical species that may be substituted and those which may not be so substituted. Thus, when the term "group" or "aryl group" is used to describe a substituent, that substituent includes the use of additional substituents beyond the literal definition of the basic group. Where the term "moiety" is used to describe a substituent, only the unsubstituted group is intended to be included. For example, the phrase, "alkyl group" is intended to include not only pure hydrocarbon alkyl chains, such as methyl, ethyl, propyl, t-butyl, cyclohexyl, iso-octyl, octadecyl and the like, but also alkyl chains bearing substituents known in the art, such as hydroxyl, alkoxy, phenyl, halogen atoms (F, Cl, Br, and I), cyano, nitro, amino, carboxy etc. For example, alkyl group includes ether groups (e.g., $CH_2CH_2CH_2$—O—), haloalkyls, nitroalkyls, carboxyalkyls, hydroxyalkyls, sulfoalkyls, etc. On the other hand, the phrase "alkyl moiety" is limited to the inclusion of only pure hydrocarbon alkyl chains, such as methyl, ethyl, propyl, t-butyl, cyclohexyl, iso-octyl, octadecyl, and the like. Substituents that react with active ingredients, such as very strongly electrophilic or oxidizing substituents, would of course be excluded by the ordinarily skilled artisan as not being inert or harmless.

Any or all of the substituents $R^2$–$R^6$ may be chosen so as to exert a ballasting effect by virtue of their size or chemical properties, to modify the diffusibility of the bleaching agents of formula I. If the bleaching agents are to be placed in a receptor layer prior to the colorant transfer process, it is important that they remain in that layer and do not migrate to the donor sheet when it is assembled in contact with the receptor, which might cause premature bleaching of the IR dye. Bulky and/or polar substituents may be used to restrict the mobility of the bleaching agent. In contrast, if a receptor such as plain paper is to be used, and the bleaching agent is to be deposited on the transferred image in a subsequent step, then a high diffusibility may be advantageous, and non-polar substituents of low molecular weight will be preferred. For ease of synthesis, the substituents $R^3$ and $R^4$ are most readily adapted for ballasting purposes.

The reactivity of the thermal bleaching agents of formula I varies with the identity of the substituent $R^1$. Compounds in which $R^1$ is H show the highest reactivity, followed by those in which $R^1$ is alkyl of up to about 5 carbon atoms. Surprisingly, when $R^1$ is an aryl group such as phenyl, the thermal bleaching action is almost totally suppressed.

Compounds of formula I suitable for use in the invention include the following:

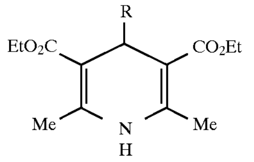

| | R |
|---|---|
| B1 | H |
| B2 | $CH_3$ |
| B3 | $C_2H_5$ |
| B4 | n-$C_3H_7$ |
| B5 | n-$C_4H_9$ |
| B6 | i-$C_4H_9$ |

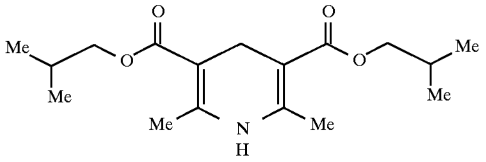

B7

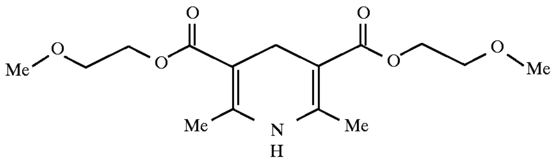

B8

The compounds of formula I may be prepared by known methods, e.g., by an adaptation of the Hantsch pyridine synthesis.

TAPM dyes suitable for use in the invention are well known in the literature and are disclosed for example in U.S. Pat. No. 5,135,842 and may be represented by formula II:

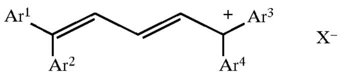

wherein $Ar^1$ to $Ar^4$ are aryl groups which may be the same or different such that a maximum of three of the aryl groups represented by $Ar^1$ to $Ar^4$ bear a tertiary amino substituent (preferably in the 4-position), and X is an anion. Preferably at least one, but no more than two, of said aryl groups bear a tertiary amino substituent. The aryl groups bearing said tertiary amino substituents are preferably attached to different ends of the polymethine chain. That is, preferably $Ar^1$ or Ar2 and $Ar^3$ or $Ar^4$ bear the tertiary amine substituents. Examples of tertiary amino groups include dialkylamino groups (such as dimethylamino, diethylamino, etc.), diarylamino groups (such as diphenylamino), alkylarylamino groups (such as N-methylanilino), and heterocyclic groups such as pyrrolidino, morpholino or piperidino. The tertiary amino group may form part of a fused ring system, e.g., one or more of $Ar^1$ to $Ar^4$ may represent a julolidine group.

The aryl groups represented by $Ar^1$ to $Ar^4$ may comprise phenyl, naphthyl, or other fused ring systems, but phenyl rings are preferred. In addition to the tertiary amino groups discussed previously, substituents which may be 10 present on the rings include alkyl groups (preferably of up to 10 carbon atoms), halogen atoms (such as Cl, Br, etc.), hydroxy groups, thioether groups and alkoxy groups. Substituents which donate electron density to the conjugated system, such as alkoxy groups, are particularly preferred.

Substituents, especially alkyl groups of up to 10 carbon atoms or aryl groups of up to 10 ring atoms, may also be present on the polymethine chain.

Preferably the anion X is derived from a strong acid (e.g., HX should have a pKa of less than 3, preferably less than 1). Suitable identities for X include $ClO_4$, $BF_4$, $CF_3SO_3$, $PF_6$, $AsF_6$, $SbF_6$ and perfluoroethylcyclohexylsulphonate.

Preferred dyes include:

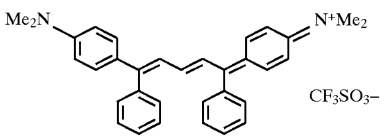

D1

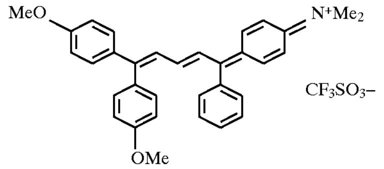

D2

The relevant dyes may be synthesized by known methods, e.g., by conversion of the appropriate benzophenones to the corresponding 1,1-diarylethylenes (by the Wittig reaction, for example), followed by reaction with a trialkyl orthoester in the presence of strong acid HX.

The dyes of formula II generally absorb in the 700 to 900 nm region, making them suitable for diode laser address. JP63-319191, JP63-319192, U.S. Pat. No. 4,950,639, EP-A-0602893 and EP-A-0675003 disclose their use as absorbers in laser addressed thermal transfer media, but of these references only the last-named addresses the problem of co-transfer of these dyes with the colorant, which gives a blue cast to the transferred image because the TAPM dyes generally have absorption peaks which tail into the red region of the spectrum. EP-A-0675003 discloses the use of nucleophiles for the purpose of bleaching the relevant dyes, and in particular the use of amines and of carbanions generated by thermal decomposition of arylsulphonylacetate salts, the latter being preferred. It has now been found that the compounds of formula I also bleach certain TAPM dyes cleanly and effectively under thermal conditions. Furthermore, coatings comprising the compounds of formula I are stable on extended storage and show no tendency for yellowing, which has proved to be a problem with the carbanion precursors which are the preferred bleaching agents according to the prior art.

The mechanism by which the bleaching occurs is not well understood, but is clearly different from the nucleophilic processes described in the prior art. In this regard, it is noteworthy that the bleaching action is not significantly affected by the identity of the substituent on the nitrogen atom ($R^2$ in formula I may be H, alkyl or aryl), whereas the substituent on the 4-position ($R^1$) exerts a profound effect. Bleaching of the TAPM dyes in their ground state is extremely rapid when $R^1$ is H, slower but still effective when $R^1$ is alkyl, but almost totally suppressed when $R^1$ is aryl. The 4-aryl derivatives, however, are effective bleaching agents for the dyes in their photoexcited state, as described in EP-A-0738609. Furthermore, 4,4-disubstituted analogues such as the 4,4-dimethyl derivative are totally inert towards the TAPM dyes, whether photoexcited or not.

The thermal bleaching action of the compounds of formula I appears to be restricted to the particular subset of the TAPM class defined earlier, since little or no bleaching is observed when the compounds are tested against IR absorbers of other classes, such as amine cation radical dyes, squarylium dyes or phthalocyanines, or TAPM dyes in which all four aryl groups bear a tertiary amino substituent.

With regard to the construction of the donor elements, apart from the use of a suitable TAPM dye as the IR absorber (where applicable), the only constraint is that the colorant should be substantially inert towards the bleaching agent under both ambient conditions and during the termal transfer process. Within these constraints, any of the donor element constructions known in the art of laser thermal transfer imaging may be used. Thus, the donor may be adapted for sublimation transfer, ablation transfer, or melt-stick transfer, for example. Typically, the donor element comprises a substrate (such as polyester sheet), a layer of colorant and the IR absorber, which may be in the same layer as the colorant, in a separate layer, or both. Alternatively, the IR absorber may be present in the receptor rather than the donor, as disclosed in International Patent Application No. WO94/04368. Other layers may be present, such as dynamic release layers as disclosed in U.S. Pat. No. 5,171,650. Alternatively, the donor may be self-sustaining, as disclosed in EP-A-0491564. The colorant generally comprises one or more dyes or pigments of the desired color dissolved or dispersed in a binder, although binder-free colorant layers are also possible, as disclosed in International Patent Application No. WO94/04368. Preferably, the colorant comprises dyes or pigments that reproduce the colors shown by standard printing ink references provided by the International Prepress Proofing Association, known as SWOP color references.

It is essential that the colorant should be inert towards the bleaching agent. Therefore, colorant dyes, e.g., for sublimation transfer, must be chosen with care and screened for possible interactions with the bleaching agent. For this reason, preferred donor elements comprise a colorant layer in the form of a dispersion of pigment particles in a binder as this greatly reduces the likelihood of unwanted colorant bleaching. Particularly preferred donor elements are of the type disclosed in EP-A-0602893 in which the colorant layer comprises a fluorocarbon compound in addition to pigment and binder.

Apart from the optional presence of the bleaching agent, the receptor elements used in the invention are entirely conventional. The elements typically comprise a substrate, such as paper or plastic sheet, bearing one or more resin coatings, optionally containing the thermal bleaching agent, or alternatively containing the IR absorber as disclosed in International Patent Application No. WO94/04368. The choice of the resin for the receptor layer, e.g., in terms of Tg, softening point, etc., may depend on the type of transfer involved (e.g., ablation, melt-stick, or sublimation). For example, to promote transfer by the melt-stick mechanism, it may be advantageous to employ similar or identical resins for both the receptor layer and the binder of the colorant donor layer. For use with the preferred donor elements, BUTVAR B76 polyvinyl butyral (Monsanto) and similar thermoplastic resins are highly suitable receptor layer materials. The receptor layer may present a smooth outer surface, or may present an irregular or roughened surface by incorporation of inert particles of the appropriate dimensions, such as polymer beads, as described, for example, in U.S. Pat. No. 4876235.

In the embodiments of the invention in which the bleaching agent is present initially in the receptor, the amount of bleaching agent employed may vary considerably, depending on the concentration and characteristics of the IR absorber used, e.g., its propensity for co-transfer with the colorant, the intensity of its visible coloration, etc. Generally, loadings of about 2 weight percent (wt%) to about 25 wt % of the solids in the receptor layer are suitable, and normally loadings are about 5 wt % to about 20 wt %.

In the embodiments of the invention in which the bleaching agent is not present initially in the receptor, the receptor need not comprise a resin layer, e.g., plain paper may be used as the receptor.

The procedure for imagewise transfer of colorant from donor to receptor is conventional. The two elements are assembled in intimate face-to-face contact, e.g., by vacuum hold down or alternatively by means of the cylindrical lens apparatus described in U.S. Pat. No. 5475418, and the assembly scanned by a suitable laser. The assembly may be imaged by any of the commonly used lasers, depending on the absorber used, but address by near infrared emitting lasers such as diode lasers and YAG lasers, is preferred. Any of the known scanning devices may be used, e.g., flat-bed scanners, external drum scanners or internal drum scanners. In these devices, the assembly to be imaged is secured to the drum or bed, e.g., by vacuum hold-down, and the laser beam is focused to a spot, e.g., of about 20 microns diameter, on the IR-absorbing layer of the donor-receptor assembly. This spot is scanned over the entire area to be imaged while the laser output is modulated in accordance with electronically stored image information. Two or more lasers may scan different areas of the donor receptor assembly simultaneously, and if necessary, the output of two or more lasers may be combined optically into a single spot of higher intensity. Laser address is normally from the donor side, but may be from the receptor side if the receptor is transparent to the laser radiation.

Peeling apart the donor and receptor reveals a monochrome image on the receptor that will in most cases be contaminated by co-transfer of the IR absorber. The process may be repeated one or more times using donor sheets of different colors so as to build a multi-color image on a common receptor. In the embodiments in which a bleaching agent is present in the receptor layer, all that is required to produce a "clean" image is an overall heat treatment of the image to activate or accelerate the bleach chemistry.

In certain embodiments, the bleaching agent is present initially in neither the donor nor the receptor, and an additional step is required to bring it into contact with the contaminated image. While this technique requires an extra step, it does allow the use of an uncoated receptor, such as plain paper. Any suitable means may be employed to apply the bleaching agent to the transferred image, but "wet" methods such as dipping, spraying, etc., are not preferred. A suitable dry method is thermal lamination and subsequent peeling of a separate donor sheet (i.e., bleaching sheet) containing the thermal bleaching agent. A bleaching agent donor sheet suitable for this purpose typically comprises a substrate (such as polyester film) bearing a layer of a thermoplastic resin (such as polyvinyl butyral, vinyl resins, acrylic resins, etc.) containing the bleaching agent of formula I in an amount corresponding to about 5 wt % to about 25 wt % of the total solids, preferably about 10 wt % to about 20 wt %. Thus the construction of a bleaching agent donor sheet in accordance with the invention is very similar to that of a receptor element in accordance with the invention, and indeed a single element might well be capable of fulfilling either purpose. However, the receptor elements preferably comprise one or more compounds of formula I of relatively low thermal diffusibility (such as the ballasted derivatives described earlier), while the bleaching agent donor elements preferably comprise one or more compounds of formula I which diffuse readily when heated.

In some situations, the receptor to which the colorant image is initially transferred is not the final substrate on which the image is viewed. For example, U.S. Pat. No. 5,126,760 discloses thermal transfer of the image from the first receptor to a second receptor for viewing purposes. In such cases, it may be convenient to provide the thermal bleaching agent in the second receptor, and/or to utilize the heat applied in the process of transferring the image to the second receptor to activate the bleaching reaction.

Advantages of the invention are illustrated by the following examples. However, the particular materials and amounts thereof recited in these examples, as well as other conditions and details, are to be interpreted to apply broadly in the art and should not be construed to unduly limit the invention.

EXAMPLES

The following is an explanation of the abbreviations, tradenames etc. which are used in the Examples.

BUTVAR—polyvinylbutyral resin supplied by Monsanto (B76 grade used)

MEK—methyl ethyl ketone (butan-2-one)

Infrared absorbing dyes D1 and D2 (invention) and D3–D5 (comparison):

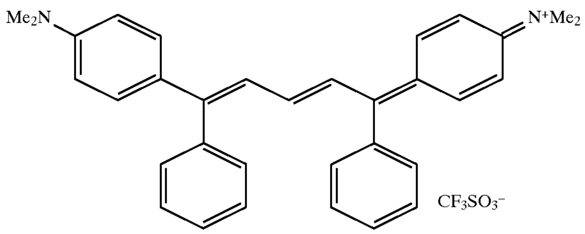

D1

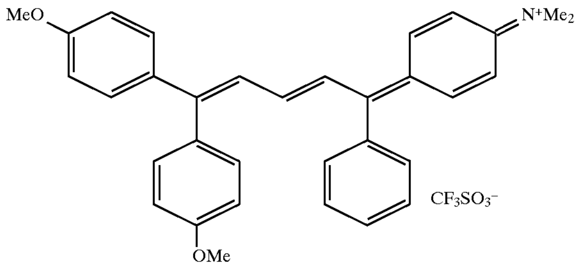

D2

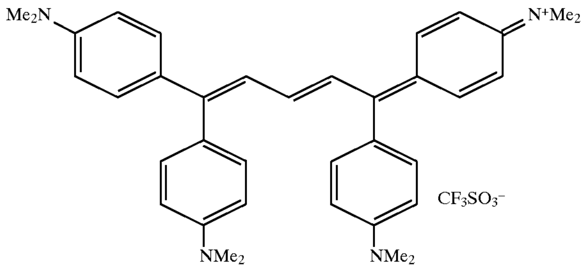

D3

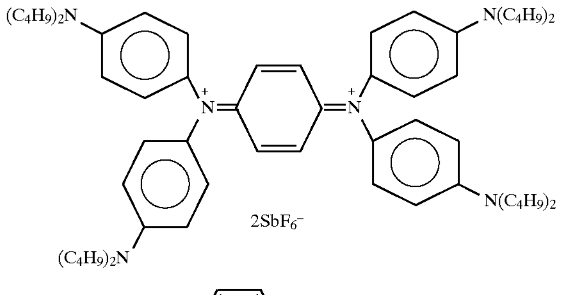

D4

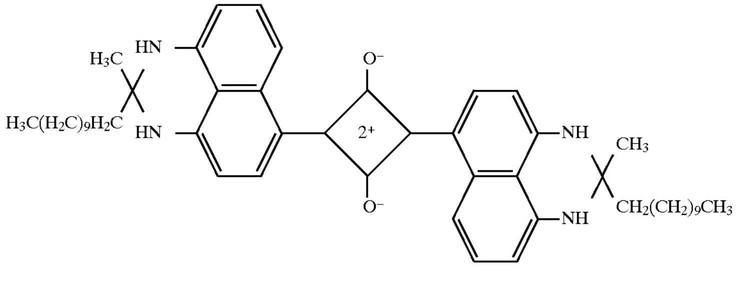

D5

Infrared absorbing dye D6 (comparison) was PROJET 830NP, a phthalocyanine dye supplied by Zeneca.

Bleaching agents B1–B7 of the invention had the structures shown earlier. Compounds C1 and C2 (comparison) had the formula:

C1

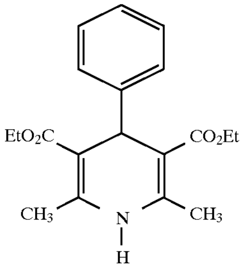

C2

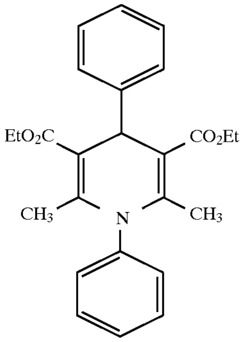

Cyan pigment (Sun 249-0592) was predispersed in BUTVAR B76 (3:2 pigment to binder, by weight) in accordance with standard procedures, and supplied in the form of chips.

All coatings were made on untreated poly(ethylene terephthalate) (PET) base unless otherwise indicated, using wire-wound bars.

Example 1

This example demonstrates the thermal bleaching of dye D1 by a variety of bleaching agents in accordance with the invention, and also the inability of compound C1 to effect bleaching under thermal conditions.

A solution (5 wt % solids) of BUTVAR polyvinyl butyral and dye D1 (in the weight ratio 4:1) was prepared in a mixture of MEK and 1-methoxypropan-2-ol (9:1 by weight), then coated at 24 $\mu$m wet thickness on 50 $\mu$m PET base and oven dried. The resulting coating (Coating A) had an absorbance of 1.1 at 830 nm.

A coating of the following formulation was made at 48 $\mu$m wet thickness on 100 $\mu$m PET base, then oven dried, giving Coating B: BUTVAR polyvinyl butyral (85 parts), compound B1 (15 parts), and MEK (1000 parts) (all parts by weight).

Samples of Coatings A and B were laminated in face-to-face contact at ambient temperature, and the optical density at 830 nm recorded after storage for various lengths of time in an oven at 100° C. Thereafter, the process was repeated 6 times, substituting, in turn, compounds B2–B6 and C1 for compound B1.

The results are shown in FIG. 1, which is a plot of optical density at 830 nm vs. heating time, and in which curve (a) shows the results for B1, curve (b) shows the results for B6, and curve (c) shows the results for C1. The curves produced by compounds B2–B6 were practically identical, and so only one is reproduced in the interests of clarity.

The results clearly show the effect of different types of substituent on the 4-position of the dihydropyridine ring of the bleaching agent. Compound B1, lacking any substituent, bleached the IR dye extremely rapidly, with a significant degree of bleaching occurring during the lamination process at room temperature. The 4-alkyl derivatives, B2–B6, showed no tendency to bleach the dye at room temperature, but did so rapidly at 100° C. The 4-aryl compound C1, however, failed to bleach the dye to any appreciable extent even after 20 minutes at 100° C.

Example 2

This example demonstrates the use of a ballasted derivative of compound B1. Although B1 is shown to be a highly-effective bleaching agent for dyes such as D1, its tendency to diffuse at ambient temperature is a disadvantage in certain applications. Compound B7 was therefore prepared in the expectation that its bulkier side chains would render it less diffusible. When tested in the manner described in Example 1, no bleaching was observed during lamination at room temperature, but 100% bleaching occurred within 3 minutes at 100° C.

Example 3

This example tests the bleaching action of compound B2 on a variety of IR dyes. The procedure of Example 1 was followed, using compound B2 in Coating B and varying the identity of the dye in Coating A. In each case, the optical density of the laminate was recorded before and after 2 minutes storage in an oven at 120° C., and the degree of bleaching assessed:

| Dye | Bleaching |
|---|---|
| D1 (invention) | total |
| D2 (invention) | total |
| D3 (comparison) | none |
| D4 (comparison) | partial |
| D5 (comparison) | none |
| D6 (comparison) | none |

Of the comparison dyes, only D4 underwent any bleaching, but this was insufficient for practical use in a laser addressed colorant transfer system.

Example 4

This example demonstrates the utility of the invention in colorant transfer imaging. The following ingredients were mixed for 1 hour at room temperature to give a homogeneous solution (all parts by weight):

| | |
|---|---|
| BUTVAR B-76 (15 wt % soln. in MEK) | 20.5 |
| Dye D1 | 0.9 |
| Compound C2 | 1.2 |
| N-methylperfluorooctanesulphonamide | 0.3 |
| Ethanol | 7.5 |
| MEK | 40.05 |

A portion (11.7 parts) of the resulting solution was mixed with 2.5 parts of a cyan pigment dispersion and 1.8 parts of MEK for 10 minutes, then coated on 100 $\mu$m PET at 36 $\mu$m wet thickness and dried for 3 minutes at 60° C. The pigment dispersion was obtained by milling 6 parts cyan pigment chips with 34 parts MEK for 1 hour in a McCrone Micronising Mill.

The resulting laser-sensitive cyan colorant donor sheet had a reflection OD of 1.2 at 830 nm from the IR dye, and a cyan OD of 1.0.

A sample of RAINBOW receptor sheet (supplied by Minnesota Mining and Manufacturing Company) was washed with acetone to remove its resin coating, and then was coated at 36 μm wet thickness with a solution of BUTVAR B-76 polyvinyl butyral (10 parts) and Bleaching Agent B2 of the invention (5 parts) in MEK (85 parts), and dried for 3 minutes at 60° C.

Samples of the donor and receptor were assembled in face-to-face contact on the drum of a laser scanner equipped with a 220 mW laser diode emitting at 830 nm. The laser beam, focused to a 23 μm diameter spot, was scanned over the assembly at varying speeds in the range 200–500 cm/second and was modulated in accordance with a test pattern corresponding to 1–99% dots from a 150 line screen. A high quality half-tone pattern was transferred to the receptor at all scan rates, except that the cyan image was contaminated by residual absorption from the IR dye (OD 0.8 at 830 nm). However, when the image-bearing receptor was placed in an oven at 140° C. for 5 minutes, the 830 nm absorption disappeared completely, without affecting the cyan absorption.

The imaging process was repeated, using uncoated paper as the receptor. As before, a high quality half-tone pattern was transferred, but the cyan image was contaminated by residual absorption from the IR dye. A bleaching agent donor was prepared by coating a solution of BUTVAR B-76 polyvinyl butyral (10 parts) and Bleaching Agent B2 of the invention (5 parts) in MEK (85 parts) on transparent PET base and drying 3 minutes at 60° C. The resulting donor was assembled in face-to-face contact with the image-bearing receptor and fed through a MATCHPRINT laminator (supplied by Minnesota Mining and Manufacturing Company) set at 140° C. The transparent PET sheet was peeled off, leaving behind the layer containing the bleaching agent. Some bleaching of the IR dye took place during the lamination process, but further heat treatment (3 minutes in an oven at 140° C.) completed the process, once again leaving the cyan absorption unaffected.

The complete disclosure of all patents, patent documents, and publications cited herein are incorporated by reference. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

What is claimed is:

1. An imaging method comprising the sequential steps of:

(a) assembling in mutual contact a receptor sheet and a colorant donor sheet, the colorant donor sheet comprising a support having coated thereon a layer of thermally transferable colorant, and at least one of said receptor sheet and said colorant donor sheet comprising an infrared-absorbing tetraarylpolymethine dye having a polymethine chain of at least 5 carbon atoms, each terminal carbon atom of said chain having two aryl substituents, a maximum of three of said aryl substituents bearing a tertiary amino substituent;

(b) exposing the assembly to laser radiation so that absorption of said laser radiation by said infrared-absorbing tetraarylpolymethine dye generates heat and causes transfer of a colorant image from the donor sheet to the receptor sheet in irradiated areas; and (c) separating the donor and receptor sheet; wherein a thermal bleaching agent is brought into contact with any infrared-absorbing tetraarylpolymethine dye present in the receptor after imaging, said bleaching agent having the formula:

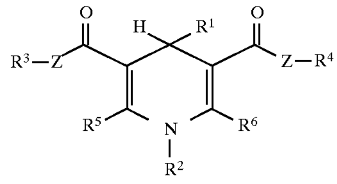

wherein:

$R^1$ is H or an alkyl group;

$R^2$ is H, an alkyl group, or an aryl group;

$R^3$–$R^6$ are independently selected from the group of alkyl groups and aryl groups; and each Z is independently oxygen or a single bond.

2. The imaging method of claim 1, wherein said infrared-absorbing tetraarylpolymethine dye is present in the donor sheet and said bleaching agent is present in the receptor sheet.

3. The imaging method of claim 1, wherein after step (c) a bleaching agent is brought into contact with the image residing on the receptor sheet.

4. The imaging method of claim 3, wherein the image residing on the receptor after step (c) is transferred to a second receptor comprising said bleaching agent.

5. The imaging method of claim 1, wherein $R^1$ is H or an alkyl group of up to 5 carbon atoms, $R^2$ is H or an alkyl group of up to 15 carbon atoms or an aryl group of up to 10 carbon atoms; $R^3$ and $R^4$ are alkyl groups of up to 5 carbon atoms; and Z is oxygen.

6. The imaging method of claim 1, wherein said infrared-absorbing tetraarylpolymethine dye has the formula:

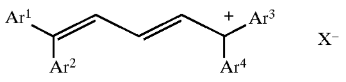

wherein:

$Ar^1$ to $Ar^4$ are aryl groups that are the same or different, and at least one, but no more than two, of said aryl groups has a tertiary amino substituent selected from the group of dialkylamino groups, diarylamino groups, alkylarylamino groups, and heterocyclic groups; and X is an anion.

7. The imaging method according to claim 6, wherein two of said aryl groups have a tertiary amino substituent in the 4-position.

8. The imaging method of claim 6 wherein X is an anion such that the pKa of HX is less than 3.

9. The imaging method of claim 2 wherein substituents $R^3$ and $R^4$ of the bleaching agent are ballasting groups.

10. A receptor element for use in laser thermal transfer imaging comprising a support having coated thereon a resin layer comprising a compound having the formula:

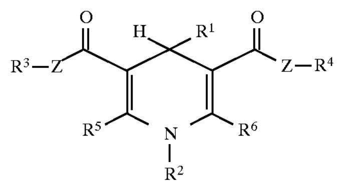

wherein:

$R^1$ is H or an alkyl group;

$R^2$ is H, an alkyl group, or an aryl group;

$R^3$–$R^6$ are independently selected from the group of alkyl groups and aryl groups; and each Z is independently oxygen or a single bond;

said receptor element being otherwise substantially free from photosensitive or other image forming chemicals.

11. An imaging system addressable by laser radiation to produce an image comprising a colorant donor sheet and a receptor sheet, said colorant donor sheet comprising a support having coated thereon a layer of thermally transferable colorant and an infrared absorbing tetraarylpolymethine dye having a polymethine chain of at least 5 carbon atoms, each terminal carbon atom of said chain bearing two aryl substituents, a maximum of three of said aryl substituents bearing a tertiary amino substituent; and said receptor sheet comprising a support having coated thereon a resin layer comprising a compound having the formula:

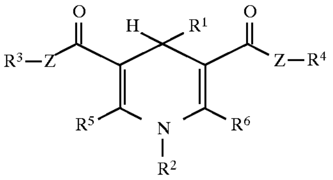

wherein:

$R^1$ is H or an alkyl group;

$R^2$ is H, an alkyl group, or an aryl group;

$R^3$–$R^6$ are independently selected from the group of alkyl groups and aryl groups; and each Z is independently oxygen or a single bond.

12. An imaging system comprising a colorant donor sheet, a receptor sheet and a bleaching sheet; the colorant donor sheet comprising a support having coated thereon a layer of thermally transferable colorant, at least one of said colorant donor sheet and said receptor sheet comprising an infrared absorbing tetraarylpolymethine dye having a polymethine chain of at least 5 carbon atom of said chain bearing two aryl substituents, a maximum of three of said aryl substituents bearing a tertiary amine substituent; and said bleaching sheet comprising a support having coated thereon a layer of a thermal bleaching agent comprising a compound having the formula:

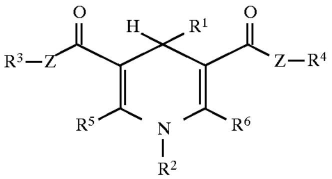

wherein:

$R^1$ is H or an alkyl group;

$R^2$ is H, an alkyl group or an aryl group;

$R^3$–$R^6$ are independently selected from the group of alkyl groups and aryl groups; and each Z is independently oxygen or a single bond.

* * * * *